(12) United States Patent
Chen

(10) Patent No.: US 7,633,044 B1
(45) Date of Patent: Dec. 15, 2009

(54) IMAGE SENSOR MODULE

(75) Inventor: Ying-Jui Chen, Taichung (TW)

(73) Assignee: Asia Optical Co., Ltd., Taichung (TW)

( * ) Notice: Subject to any disclaimer, the term of this patent is extended or adjusted under 35 U.S.C. 154(b) by 0 days.

(21) Appl. No.: 12/272,888

(22) Filed: Nov. 18, 2008

(30) Foreign Application Priority Data

Oct. 9, 2008    (TW) .............................. 97138908 A

(51) Int. Cl.
*H01L 31/00* (2006.01)
(52) U.S. Cl. ...................... 250/214.1; 250/239; 250/238
(58) Field of Classification Search ............. 250/214 R, 250/239, 238, 214.1, 216; 348/125
See application file for complete search history.

(56) References Cited

U.S. PATENT DOCUMENTS

| 6,703,598 B2 * | 3/2004 | Muramatsu et al. ......... 250/239 |
| 2007/0001102 A1 * | 1/2007 | Inoguchi ................. 250/214 R |

* cited by examiner

*Primary Examiner*—Seung C Sohn
(74) *Attorney, Agent, or Firm*—Thomas, Kayden, Horstemeyer & Risley

(57) ABSTRACT

An image sensor module including a base, an image sensing unit, a filter, and at least an exhaust unit is disclosed. The base has a first binding plate which is opposite to a second binding plate, and a space, wherein both of the first and the second binding plates are vertical to an optical axis. The image sensor unit and the filter respectively bind to the first and the second binding plates. The exhaust unit binding to the second plate has a first exhaust entrance connecting to the space, an exhaust outlet connecting to the outside, and an exhaust path connecting to the first exhaust entrance.

7 Claims, 5 Drawing Sheets

IMAGE SENSOR MODULE

CROSS-REFERENCE TO RELATED APPLICATION

This application claims priority of Taiwanese Application No. 097138908, filed on Oct. 9, 2008.

BACKGROUND OF THE INVENTION

1. Field of the Invention

This invention relates to an image sensor module, and more particularly, to an image sensor module which has good exhaust effect.

2. Description of the Related Art

The focal length of most miniaturized image sensor modules installed in cell phones or notebooks is fixed. The optical members in the image sensor modules are bound to one another and baked for fixing. During the baking process, if heat is not exhausted in a proper manner, the circuit board will distort and negatively affect the focal length of the optical members or the optical members will flake off because of the distortion.

Referring to FIG. 1 and FIG. 2, the image sensor module includes a base 11, an image sensing unit 12 binding to the base 11, a filter 13 binding to the base 11, a space 14 formed by the base 11 and the image sensing unit 12, and an exhaust hole 15 formed of the base 11. The exhaust hole 15 can connect the space 14 to the outside.

After binding the image sensing unit 12 and the filter 13 to the base 11, the baking process is performed. During the baking process, the air in the space 14 will expand because of the heat and then be exhausted through the exhaust hole 15.

Because the exhaust hole 15 is parallel to an optical axis L1, after the baking process, dust will easily enter the space 14 through the exhaust hole 15. Thus, in efforts to avoid negative dust effects of the image sensor module 1, the exhaust hole 15 is filled with a UV resin and then cured by an ultraviolet light, so that the UV resin in the exhaust hole 15 can be fixed.

However, the manufacturing process of the image sensor module 1 described above is complicated, due to the UV resin filling and curing process. Thus, costs are increased along with manufacturing time. Therefore, providing an image sensor module which has good exhaust effect is very important.

SUMMARY OF THE INVENTION

Therefore, the object of the present invention is to provide an image sensor module which has good exhaust effect.

Accordingly, an image sensor module of the present invention comprises a base, an image sensing unit, a filter, and at least an exhaust unit.

The base has a first binding plate which is vertical to an optical axis, a second binding plate disposed opposite to the first binding plate, and a space connected to the first and the second binding plates and disposed along the optical axis. The image sensing unit binds to the first binding plate. The filter binds to the second binding plate. The exhaust unit binding to the second binding plate includes a first exhaust entrance connected to the space, an exhaust outlet connected to the outside, and an exhaust path connected to the first exhaust entrance and the exhaust outlet. The exhaust path is vertical to the optical axis.

The present invention hinders dust from entering the exhaust unit because the exhaust path is vertical. Therefore, the image sensor module of the invention has good exhaust effect.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
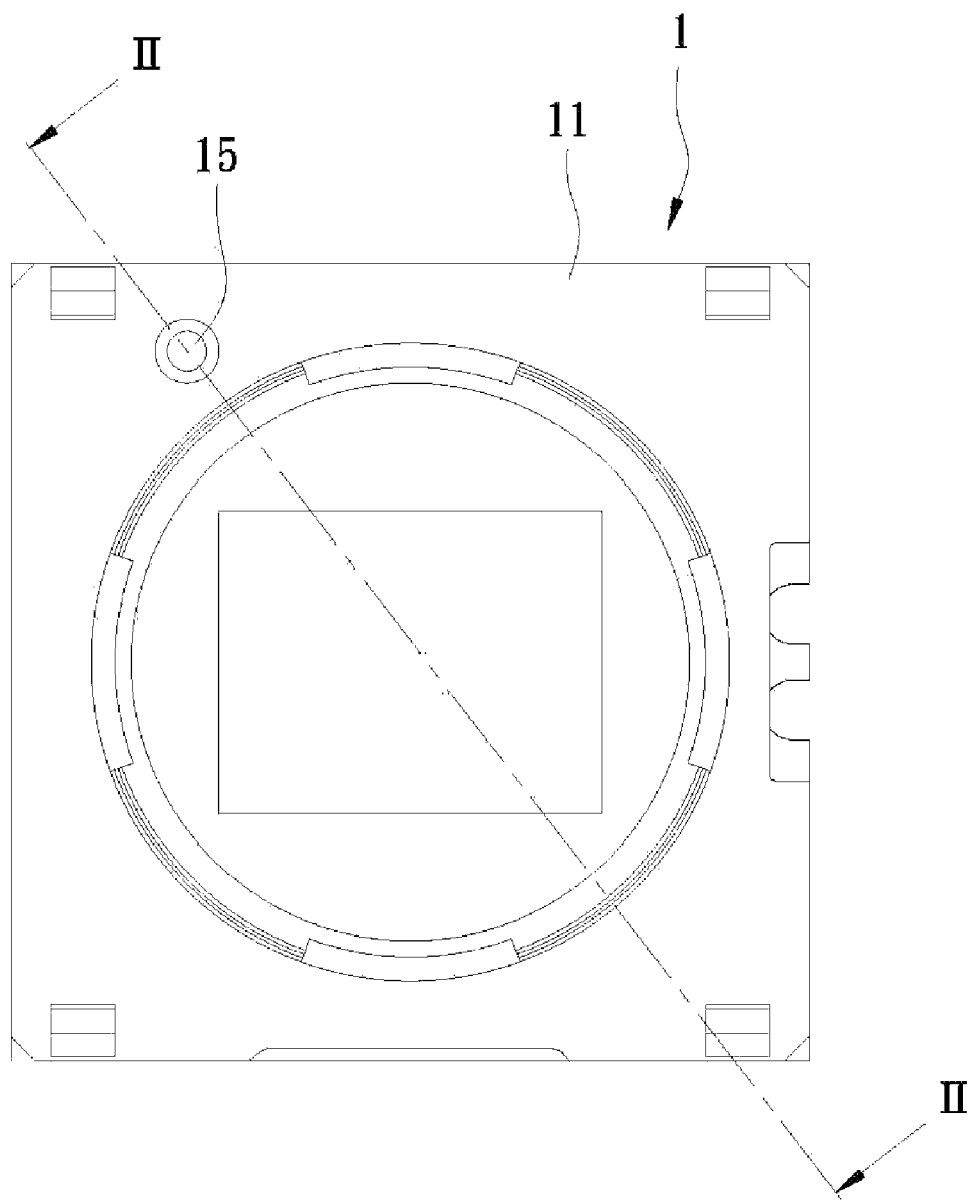
FIG. 1 is a top view of the conventional image sensor module.
Figure 2:
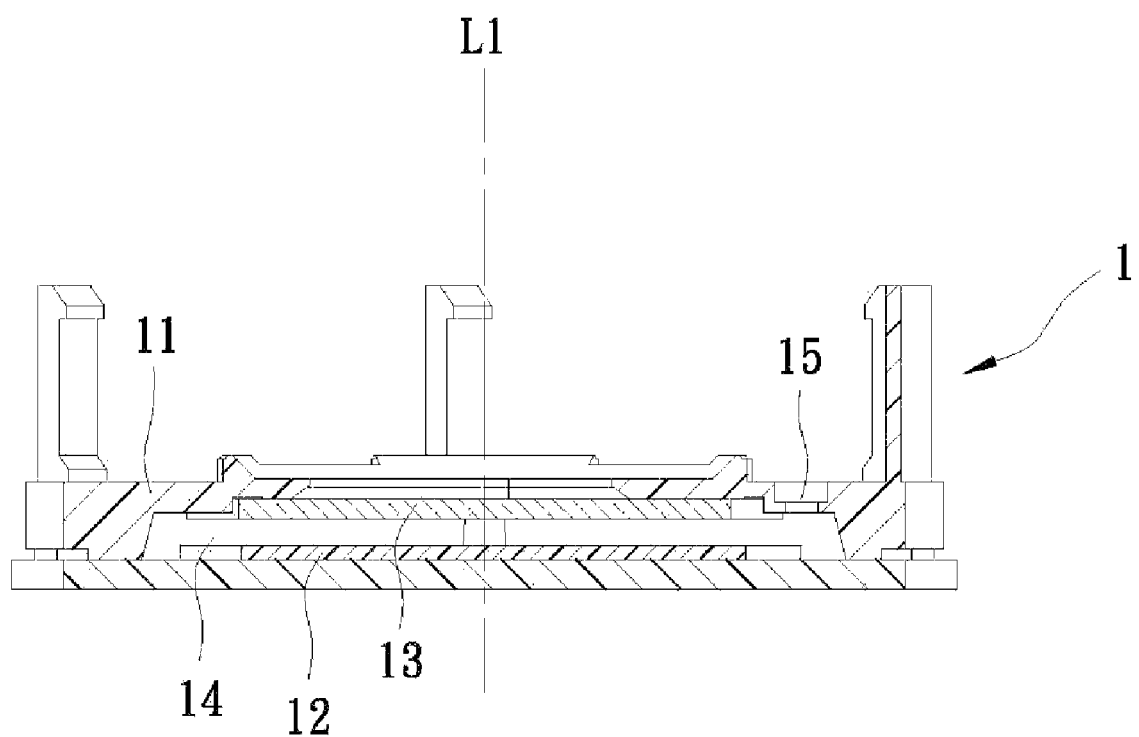
FIG. 2 is sectional side view along a line II-II of FIG. 1, illustrating an exhaust hole of the image sensor module being parallel to an optical axis.
Figure 3:
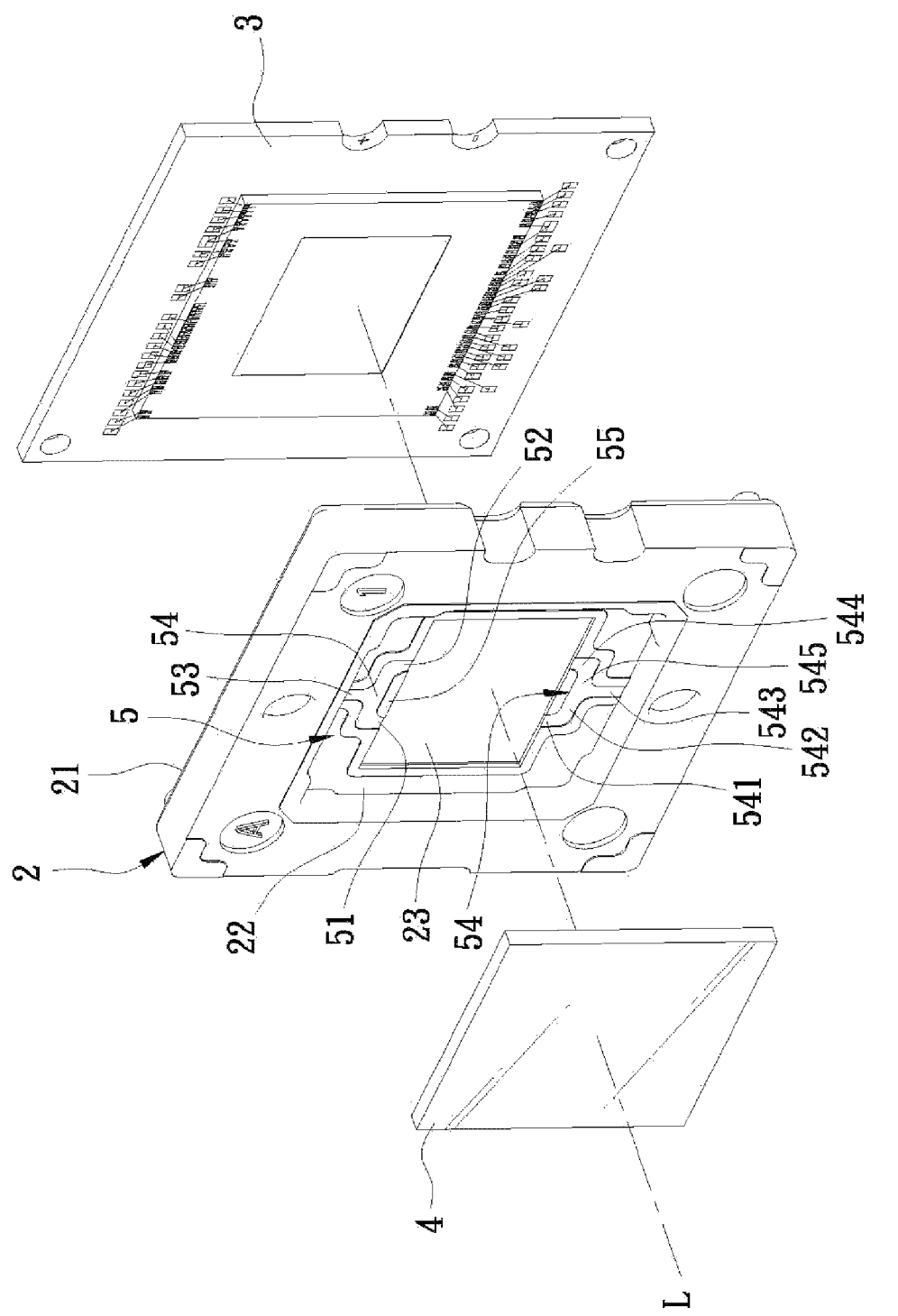
FIG. 3 is a fragmented exploded perspective view of a preferred embodiment of an image sensor module of the invention.

Referring to FIG. 3, a preferred embodiment of an image sensor module of the invention comprises a base 2, an image sensing unit 3, a filter 4, and two exhaust units 5.

The base 2 includes a first binding plate 21 which is vertical to an optical axis L, a second binding plate 22 disposed opposite to the first binding plate 21, and a space 23 along the optical axis L, connected to the first and the second binding plates 21, 22.

The image sensing unit 3 binds to the first binding plate 21.

The filter 4 binds to the second binding plate 22.

Figure 4:
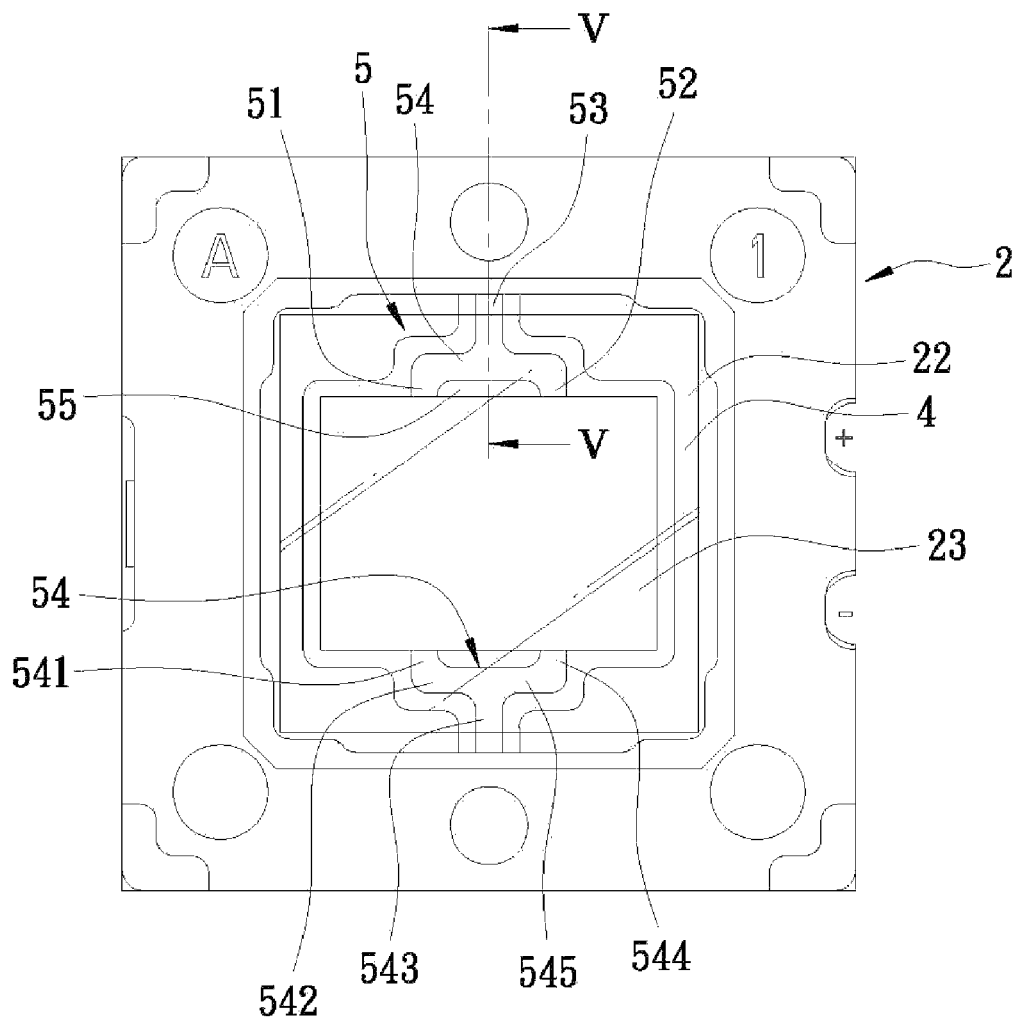
FIG. 4 is a top view, illustrating the shape of an exhaust path of a preferred embodiment of an image sensor module of the invention.

Referring to FIG. 3 and FIG. 4, the exhaust units 5 comprise the second binding plate 22 of the base 2. It includes a first exhaust entrance 51 and a second exhaust entrance 52 connected to the space 23 respectively, an exhaust outlet 53 connected to the outside, an exhaust path 54 connected to the first and the second exhaust entrances 51, 52 and the exhaust outlet 53, and a stopper 55.

Note that the exhaust outlets 53 of the preferred embodiment of the invention is not sealed, in efforts to omit the sealing and resin curing process of the conventional method. Therefore, it is imperative that the exhaust unit 5 hinders dust from entering the exhaust unit 5 while having an exhaust function.

Thus, the exhaust paths 54 for the preferred embodiment of the invention are vertical to the optical axis L. Specifically, because dust enters the exhaust unit more easily if the exhaust unit is parallel to the optical axis L, by making the exhaust paths 54 vertical to the optical axis L, dust is hindered from entering the entrance of the space 23.

Additionally, because each exhaust path 54 is tortuous and connected to the first and the second exhaust entrances 51, 52, the dust contact area and exhaust path 54 is increased, as the dust is absorbed in each exhaust path 54 by the Van der Waals force. Thus, hindering dust from entering the entrance of the space 23, and extending operating lifespan of the image sensor module.

Figure 5:
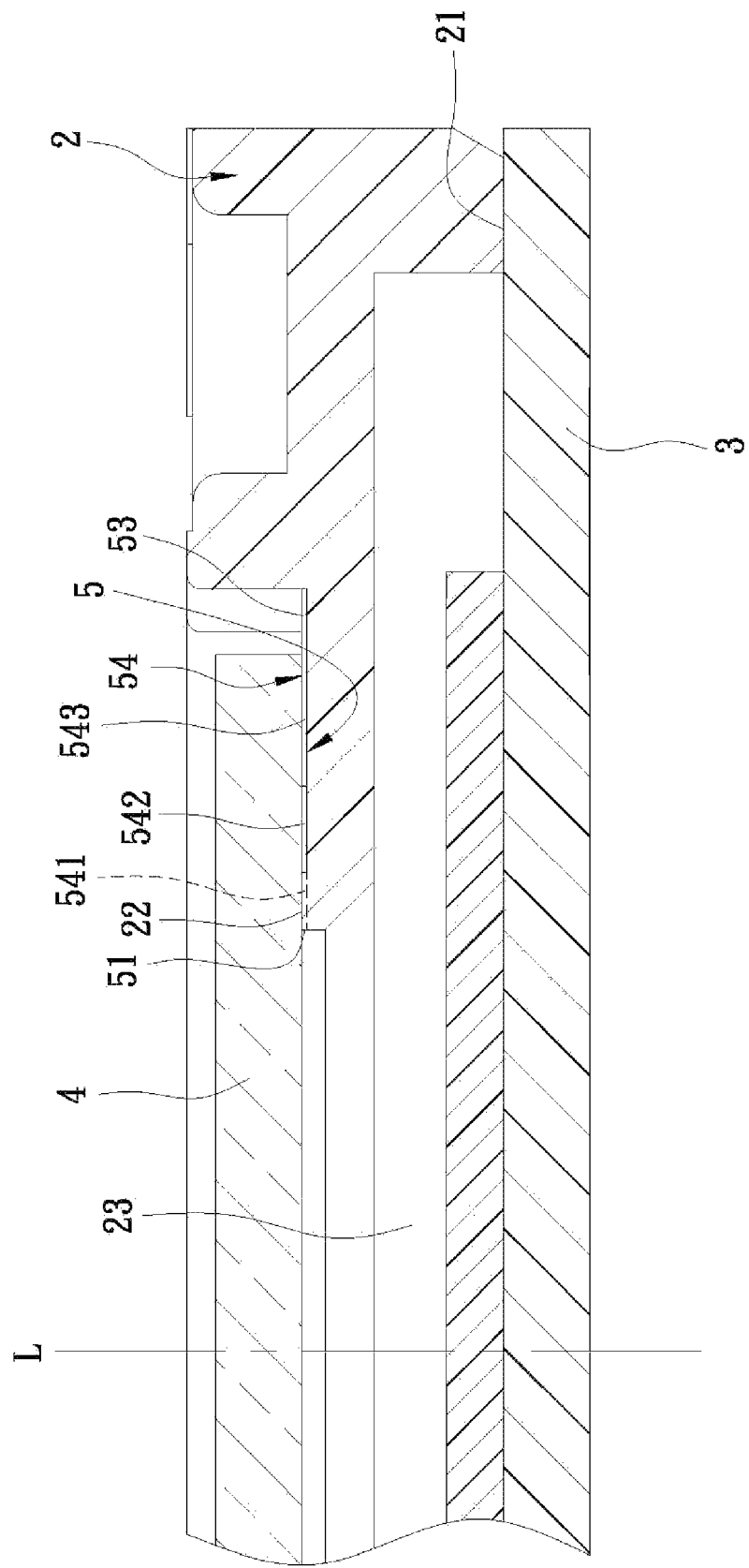
FIG. 5 is a sectional side view along a line V-V of FIG. 4, illustrating a very narrow gap of the exhaust path of the preferred embodiment of an image sensor module of the invention.

Referring to FIG. 5, furthermore, the transections of the exhaust paths 54 are long and narrow, and the width of the gaps along the optical axis L in the exhaust paths 54 is equal to or smaller than 0.05 mm, preferably, between 0.02 mm and 0.03 mm. Thus, the small size prevents dust greater than 0.05 mm in diameter from entering the exhaust path 54. Meanwhile, dust smaller than 0.05 mm in diameter is absorbed in the exhaust path 54 by the Van der Waals force.

Referring to FIG. 4 and FIG. 5, in this preferred embodiment, each exhaust path 54 has a first entrance part 541 connected to the first exhaust entrance 51, a first turning part 542 tortuously connected to the first entrance part 541, an exhaust exit part 543 tortuously connected to the first turning part 542, a second entrance part 544 connected to the second exhaust entrance 52, and a second turning part 545 tortuously extended from the second entrance part 544 to the exhaust exit part 543.

Each second entrance part 544 and each second turning part 545 are symmetrical respectively to the first entrance part 541 and the first turning part 542.

Each stopper 55 is formed by the first and the second turning parts 542, 545 and the first and the second entrance part 541, 544. The stopper 55 decreases dust from the outside to enter the space 23, along with polluted air.

Note that the image sensor module can include one exhaust unit 5 or more than two. One exhaust unit 5 can hinder dust from entering the space 23. Meanwhile, a plurality of exhaust units 5, can not only hinder dust from entering the space 23, due to the manufacturing method, resin is prevented from overflowing and jamming pathways.

In summary, because the exhaust paths 54 are vertical to the optical axis L, dust is prevented from entering the exhaust path 54. Additionally, because the exhaust paths 54 are tortuous and the sectional areas are very small, the areas to capture the dust are increased. Also, the stopper hinders polluted air from entering the exhaust path 54. Therefore, the present invention hinders dust from entering the exhaust unit because the exhaust path is vertical and the sealing and resin curing processes are eliminated. The image sensor module of the invention has good exhaust effect.

While the present invention has been described in connection with what is considered the most practical and preferred embodiment, it is understood that this invention is not limited to the disclosed embodiment but is intended to cover various arrangements included within the spirit and scope of the broadest interpretation so as to encompass al such modifications and equivalent arrangements.

What is claimed is:

1. An image sensor module comprising:
   a base having a first binding plate which is vertical to an optical axis, a second binding plate which is opposite to the first binding plate, and a space connecting the first and the second binding plates, disposed along the optical axis;
   an image sensing unit binding to the first binding plate;
   a filter binding to the second binding plate; and
   at least one exhaust unit binding to the second binding plate of the base having a first exhaust entrance connected to the space, an exhaust outlet connected to the outside, an exhaust path tortuously connected to the first exhaust entrance and the exhaust outlet on a plane parallel to the second binding plate;
   wherein the exhaust path is in a direction perpendicular to the optical axis.

2. The image sensor module as claimed in claim 1, wherein the exhaust path has a first entrance part connected to the first exhaust entrance, a first turning part tortuously connected to the first entrance part, and an exhaust exit part tortuously connected to the first turning part.

3. The image sensor module as claimed in claim 2, wherein the exhaust unit further comprises a second exhaust entrance connected to the space, and the exhaust path further has a second entrance part connected to the second exhaust entrance, and a second turning part tortuously extended from the second entrance part to the exhaust exit part, wherein the second entrance part and the second turning part are symmetrical respectively to the first entrance part and the first turning part.

4. The image sensor module as claimed in claim 3, wherein the exhaust unit further comprises a stopper formed by the first and the second turning parts and the first and the second entrance parts.

5. The image sensor module as claimed in claim 1, wherein the transection of the exhaust path is long and narrow.

6. The image sensor module as claimed in claim 5, wherein the width of the gap along the optical axis in the exhaust path is equal to or smaller than 0.05 mm.

7. The image sensor module as claimed in claim 6, wherein the width of the gap along the optical axis in the exhaust path is between 0.02 mm and 0.03 mm.

* * * * *